(12) United States Patent
Van'tZelfde

(10) Patent No.: US 11,886,669 B2
(45) Date of Patent: Jan. 30, 2024

(54) SYSTEMS AND METHODS FOR CAPACITIVE SENSING WITH SECONDARY ELECTRODES EXPOSED TO ELECTRIC FIELDS FROM A PRIMARY ELECTRODE

(71) Applicant: Joyson Safety Systems Acquisition LLC, Auburn Hills, MI (US)

(72) Inventor: Dwayne Van'tZelfde, Holly, MI (US)

(73) Assignee: Joyson Safety Systems Acquisition LLC, Auburn Hills, MI (US)

( * ) Notice: Subject to any disclaimer, the term of this patent is extended or adjusted under 35 U.S.C. 154(b) by 61 days.

(21) Appl. No.: 17/126,920

(22) Filed: Dec. 18, 2020

(65) Prior Publication Data

US 2021/0191540 A1 Jun. 24, 2021

Related U.S. Application Data

(60) Provisional application No. 62/951,296, filed on Dec. 20, 2019.

(51) Int. Cl.
*G06F 3/044* (2006.01)
*G06F 3/038* (2013.01)
(Continued)

(52) U.S. Cl.
CPC ............ *G06F 3/044* (2013.01); *B62D 1/046* (2013.01); *G06F 3/0383* (2013.01); *H03K 17/955* (2013.01)

(58) Field of Classification Search
CPC ....... G06F 3/044; G06F 3/0383; B62D 1/046; B62D 1/06; H03K 17/955;
(Continued)

(56) References Cited

U.S. PATENT DOCUMENTS 6,218,947 B1 4/2001 Sutherland
6,392,195 B1 5/2002 Zhao et al.
(Continued)

FOREIGN PATENT DOCUMENTS

DE 102017205640 B3 * 7/2018
JP 2010-238642 10/2010
(Continued)

OTHER PUBLICATIONS

International Search Report and Written Opinion issued for Application No. PCT/US2020/065975, dated Apr. 6, 2021, 11 pages.

*Primary Examiner* — David D Davis
(74) *Attorney, Agent, or Firm* — Meunier Carlin & Curfman LLC

(57) ABSTRACT

A sensor system includes a first electrode serving as a primary electrode with a controller electrically and physically coupled to the first electrode. Computer executable instructions execute software commands on the controller causing the controller to apply a voltage to the first electrode to generate an electric field around the first electrode. A second electrode has at least a portion of the second electrode being disposed within the electrical field generated by the first electrode, and the second electrode operates while being physically decoupled from the controller. The electrical field generated by the first electrode induces a corresponding charge on the second electrode, and proximity of a conductive material on or near the first or second electrode alters the electrical signal received back by the controller from the first electrode to allow for sensing the conductive material.

15 Claims, 9 Drawing Sheets

(51) Int. Cl.
H03K 17/955 (2006.01)
B62D 1/04 (2006.01)

(58) Field of Classification Search
CPC ........ H03K 2217/960755; H03K 2217/96077; H03K 17/9622
See application file for complete search history.

(56) References Cited

U.S. PATENT DOCUMENTS

| | | |
|---|---|---|
| 8,516,697 B2 | 8/2013 | Akaike et al. |
| 9,266,454 B2 | 2/2016 | Barfuss et al. |
| 9,315,133 B2 | 4/2016 | Howick et al. |
| 9,346,480 B2 | 5/2016 | Maguire et al. |
| 10,036,843 B2 | 7/2018 | Lisseman |
| 10,773,743 B2 | 9/2020 | Park et al. |
| 10,822,014 B2 | 11/2020 | Boittiaux et al. |
| 2013/0009654 A1* | 1/2013 | Kandler ................ B60N 2/002 324/686 |
| 2013/0068748 A1 | 3/2013 | Csonti et al. |
| 2014/0151356 A1* | 6/2014 | Maguire ................ B62D 1/065 219/204 |
| 2015/0345998 A1* | 12/2015 | Lamesch ............... B60N 2/5685 324/686 |
| 2015/0355710 A1* | 12/2015 | Modarres ................ G09G 5/003 345/173 |
| 2016/0150593 A1 | 5/2016 | Barfuss et al. |
| 2017/0079089 A1 | 3/2017 | Okazaki et al. |
| 2019/0275860 A1* | 9/2019 | Migneco ............. B60H 1/00742 |

FOREIGN PATENT DOCUMENTS

| | | |
|---|---|---|
| JP | 2014-190856 | 10/2014 |
| KR | 1020190073847 | 6/2019 |
| WO | 2015097219 | 7/2015 |

* cited by examiner

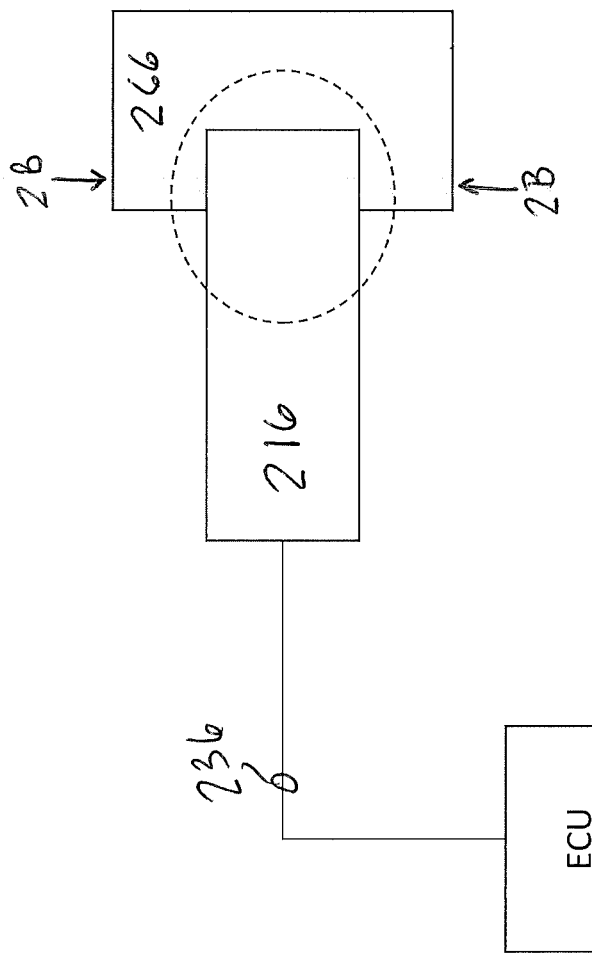
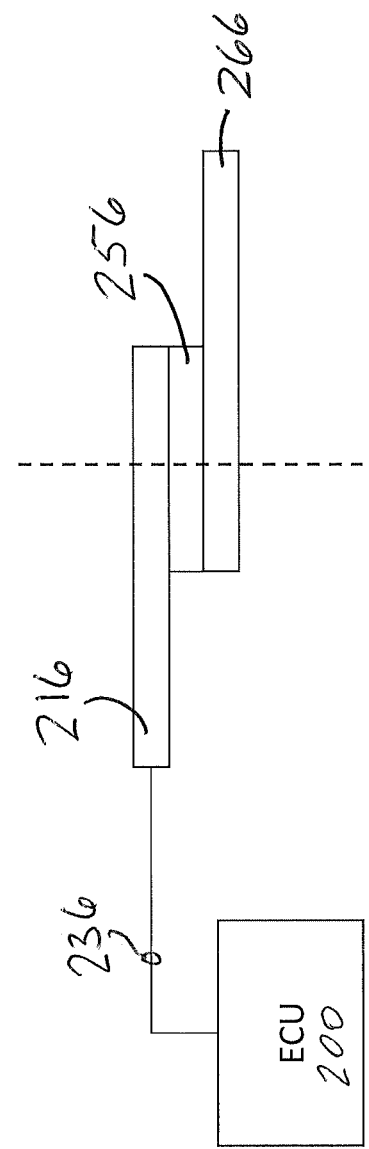
FIG. 2A
FIG. 2B

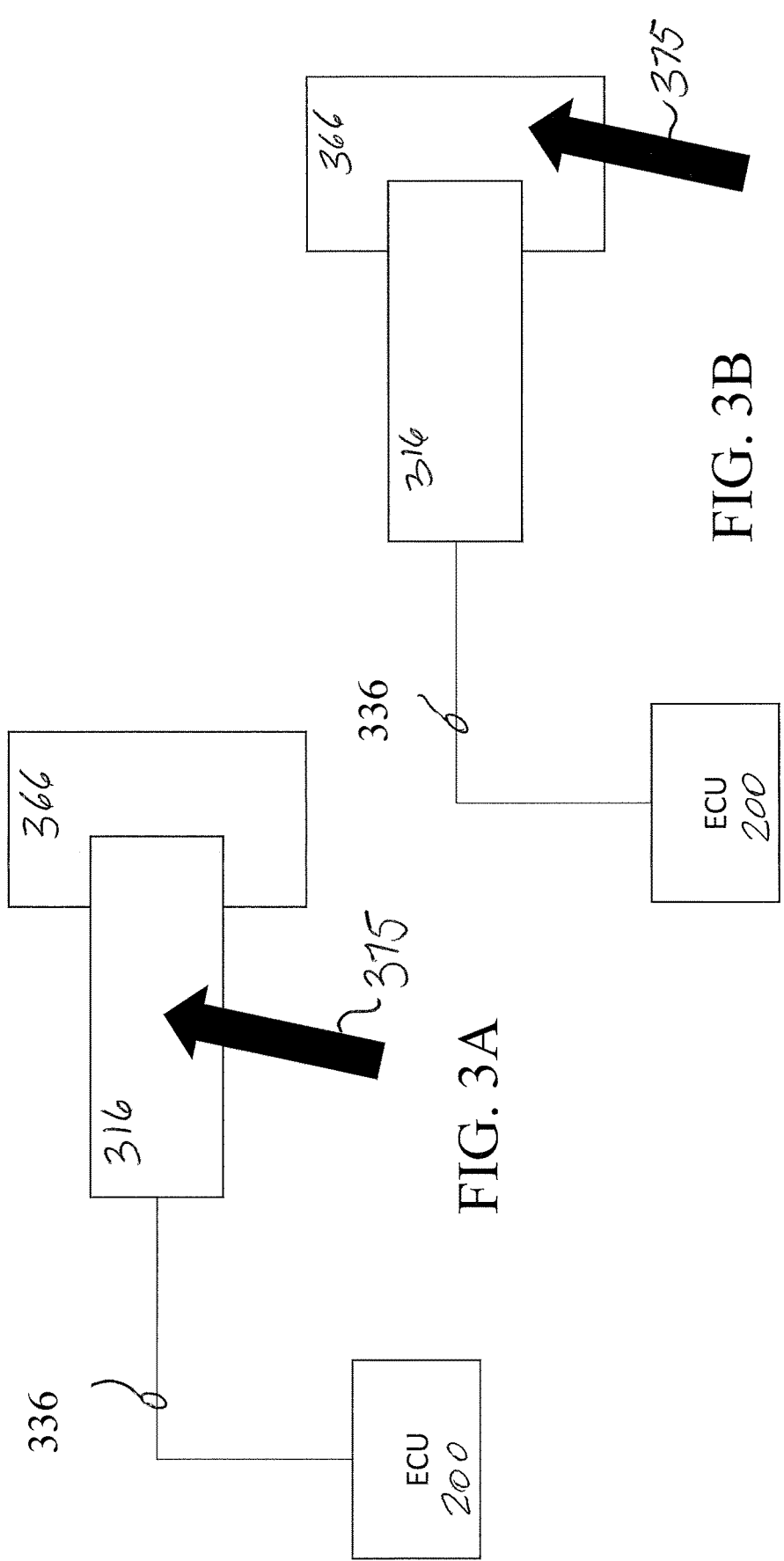

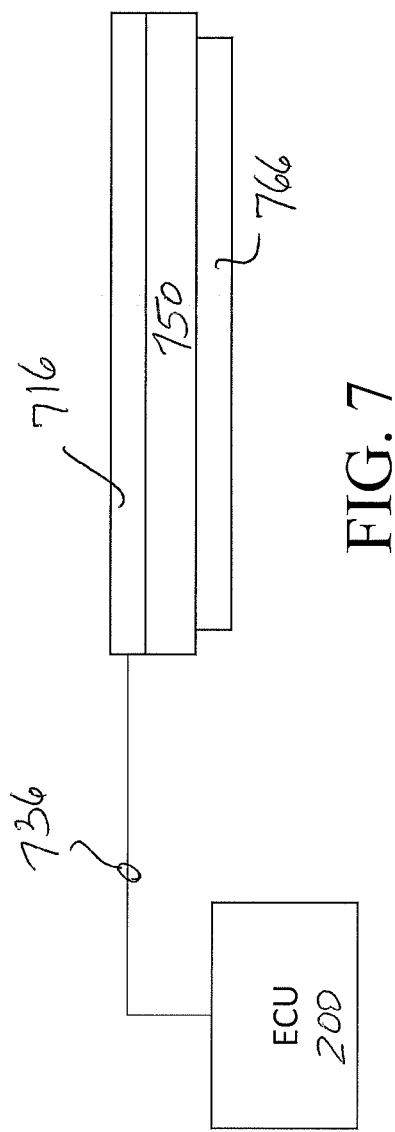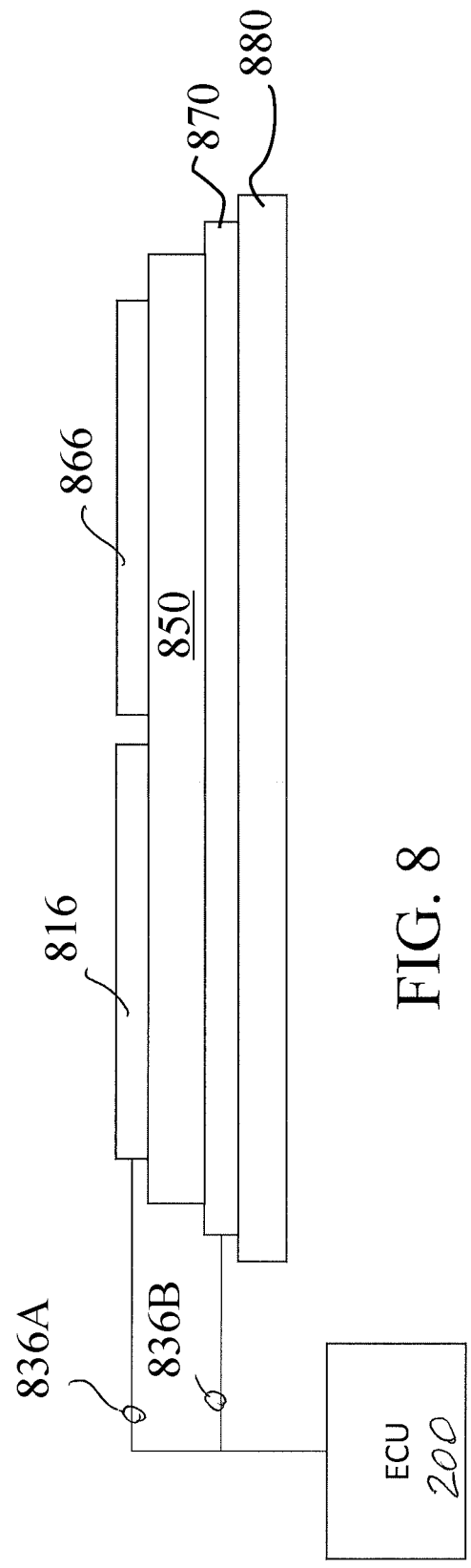

SYSTEMS AND METHODS FOR CAPACITIVE SENSING WITH SECONDARY ELECTRODES EXPOSED TO ELECTRIC FIELDS FROM A PRIMARY ELECTRODE

CROSS REFERENCE TO RELATED APPLICATIONS

This application claims priority to and incorporates by reference U.S. Provisional Patent Application Ser. No. 62/951,296 filed on Dec. 20, 2019, and entitled "Systems and Methods for Extended Proximate Sensing in a Vehicle.

BACKGROUND

Current vehicle components, including but not limited to steering wheel designs, may include a sensor mat disposed thereon for occupancy detection, occupancy classification, and vehicle control system programming. Prior embodiments of this technology, for example, are used to wrap around a rim of a steering wheel or placed in a seat cushion such that associated electronics detect presence and position of one or more occupants. In one prior art embodiment, the sensors utilize capacitive sensing technology to identify hands on the steering wheel rim. The sensor mat is disposed between an outer skin of the steering wheel and a rim of a steering wheel frame. The steering wheel frame is typically made of metal, such as a magnesium alloy or steel, and can be a source of interference for the electrical signal(s) in the sensor mat. Other embodiments of capacitive sensing technology utilize similar sensors on substrates for installations in seats, armrests, or any occupant accessible vehicle component that can provide useful data to a vehicle computer. Most of these sensors include data transmission media for sending and receiving appropriate signals to and from the sensor.

According to various prior implementations, such as the prior art embodiments of FIGS. 1A-1E, vehicle sensor systems often utilize a sensor mat 8, a shield mat 7, and an electronic control unit (ECU) 200 illustrated as incorporating numerous computerized components in FIG. 1E. The sensor mat includes one or more sensing loop circuits 22a, 22b, 22c positioned on a sensor mat substrate 16 and in communication with the ECU via communications connections 36a, 36b, 36c. Each of the sensing loops defines a sensing zone 24a, 24b, 24c as illustrated in FIG. 1B.

In some earlier embodiments, the shield mat 7 may be disposed between the sensor mat 8 and an interfering object, such as a metal steering wheel frame 12 of FIG. 1A or a metal seat frame or a separate heater installation. The shield mat 7 is shown by illustration in FIG. 1D and typically includes one or more conductive loops 24a, 24b, 24c positioned on a shield mat substrate 18 and in communication with the ECU via corresponding communication circuits 34A, 34b, 34c. The sensing loops and the shielding conductive loops are configured for operation with an electronic control unit (ECU) 200 that is in communication with the sensor mat and the shield mat and includes a power source configured for generating respective voltage that allow for operating one or more sensing zones of the sensor mat and shielding the sensor mat from interference.

Prior art systems may also use the sensor mats and shielding mats in the presence of an existing heater installation such as heater mat 6 of FIG. 1 similarly set up in heating zones 52a, 52b, 52c, from which the sensor mat 8 also requires shielding, or in at least one implementation, either the sensor mat or the shielding mat may be configured to operate as a heater during a portion of the ECU power management duty cycle.

With the continued growth of automation in vehicle operation, and with smart control systems managed by a vehicle CPU in modern transportation systems, manufacturers have been searching for ways to install the above noted sensor technology in more obscure areas all over the vehicle. Some of these installations require close fitting construction in hard to reach areas of the vehicle where return wiring or other transmission media are hard to locate but are necessary for communication with vehicle computers, including ECU 200 of FIG. 1E.

Accordingly, there is a need in the art for improved sensing apparatuses and systems that take into account sensor placement in tight fitting vehicle components. Also, as described above, current hand and occupant detection sensors, for implementations including but not limited to hands on wheel steering wheel controls, rely on making a physical connection to the sensing circuit (i.e., the sensor zone). The circuit itself may be positioned, for example, around a steering wheel rim. Once positioned on the wheel, the sensor zone is connected to a capacitive sensing controller via the electronic control unit (ECU). Without the physical electrical connection from the ECU to the sensor zone(s), the sensing area will not be functional. The sensing area and density of the sensor may be limited by the material technology, for example multi-stranded copper wire is stitched with a spacing of ~2 mm to increase the effective surface density. Limitations exist with the wire stitching technology such that a higher density increases risk of damaging the neighboring wires. These issues present another opportunity to advance sensing technology with at least one goal of increasing the effective sensor surface area while retaining the benefits of current manufacturing systems, such as stitched wire sensors.

BRIEF SUMMARY

A sensor system includes a first electrode 216 serving as a primary electrode with a controller 200 electrically and physically coupled to the first electrode 216. The controller has computerized hardware such as a processor and a memory, the memory storing computer executable instructions for execution by the processor. The computer executable instructions execute software commands that apply a voltage to the first electrode 216 to generate an electric field around the first electrode, which in turn causes the processor to receive an electrical signal back from the first electrode via a connected circuit 236. The system further includes a second electrode 266, at least a portion of the second electrode being disposed within the electrical field generated by the first electrode, and the second electrode 266 operates while being physically decoupled from the controller 200. The electrical field generated by the first electrode 216 induces a corresponding charge on the second electrode 266, and proximity of a conductive material on or near the first or second electrode alters the electrical signal received back by the controller 200 from the first electrode 216. The conductive material may be a vehicle occupant's hand, another body part, or any object that alters the electric field exhibited by the first electrode 216. The sensor system of FIG. 2A illustrates that a controller output transmitted to the first electrode via connected circuit 236 induces the electric field and sets a baseline signal for comparing to the electrical signal received back from the first electrode 216 by the controller processor.

BRIEF DESCRIPTION OF THE DRAWINGS

The components in the drawings are not necessarily to scale relative to each other. Like reference numerals designate corresponding parts throughout the several views.

FIG. 2A illustrates a top view of proximate sensing substrate positions according to one implementation of this disclosure.

FIG. 2B illustrates a cross section view of the proximate sensing substrate positions according to the embodiment of FIG. 2A.

FIG. 3A illustrates a top view of proximate sensing substrate positions and available sensing areas according to one implementation of this disclosure.

FIG. 3B illustrates the top view of FIG. 3A with sensing substrate positions and additional proximate sensing areas available according to one implementation of this disclosure.

FIG. 7 illustrates a side view of a sensor system according to one embodiment of this disclosure in which sensors are positioned on opposite sides of a single substrate according to one embodiment of this disclosure.

FIG. 8 illustrates a side view of a sensor system according to one embodiment of this disclosure in which a shield layer is positioned between a source of signal interference and a substrate incorporating the proximate sensing structures of this disclosure.

DETAILED DESCRIPTION

Figure 1A:
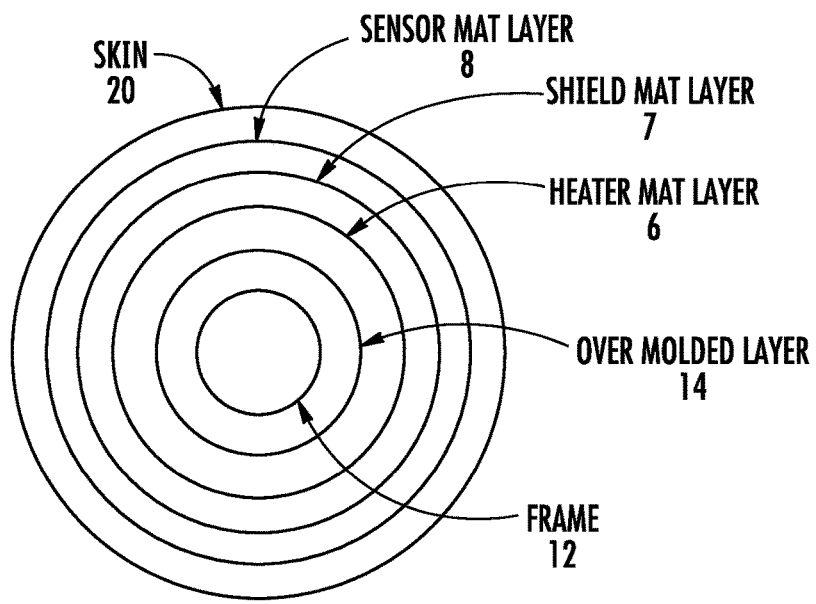
FIG. 1A illustrates a PRIOR ART cross sectional view of layers in a steering wheel according to one implementation of this disclosure.
Figure 1B:
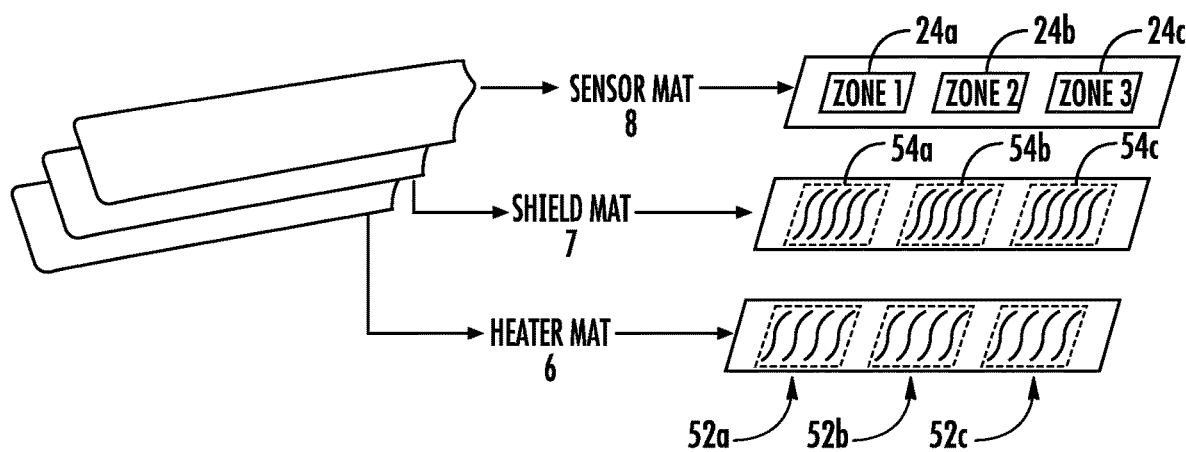
FIG. 1B illustrates a PRIOR ART perspective view of a sensor mat layer, a shield mat layer, and heater mat layer according to the implementation in FIG. 1A.
Figure 1C:
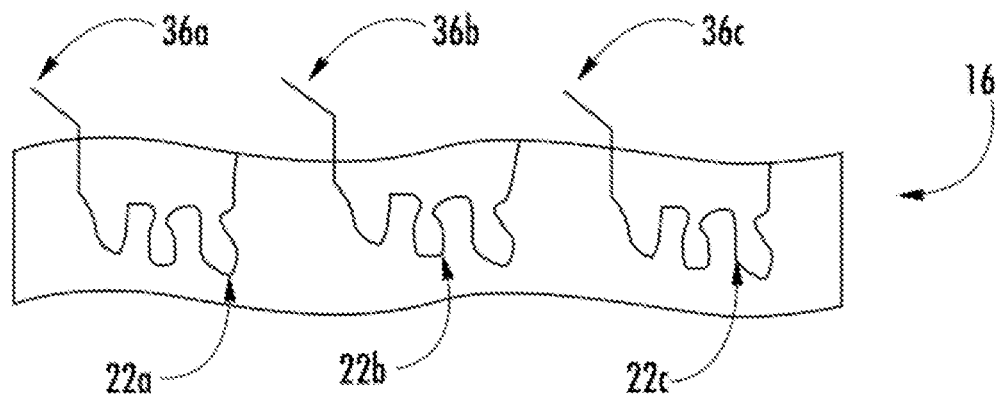
FIG. 1C illustrates a PRIOR ART schematic diagram of the sensor mat circuits implemented in the example of FIGS. 1A and 1B.
Figure 1D:
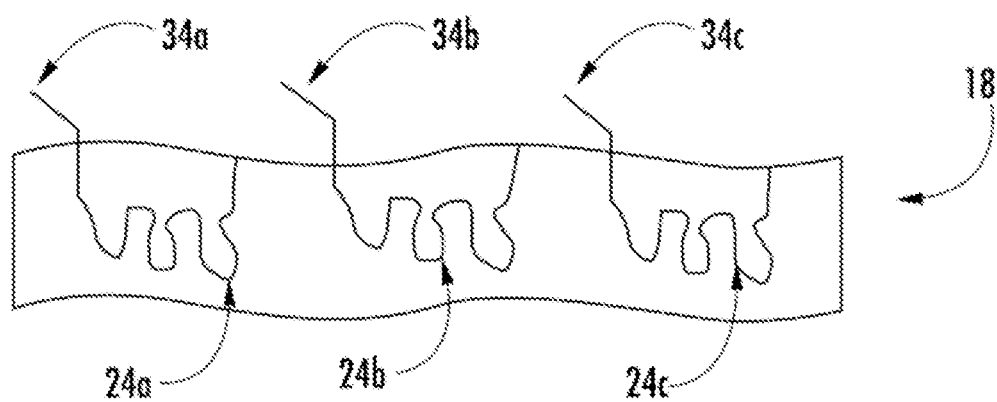
FIG. 1D illustrates a PRIOR ART schematic diagram of the shielding mat circuits of FIGS. 1A and 1B.
Figure 1E:
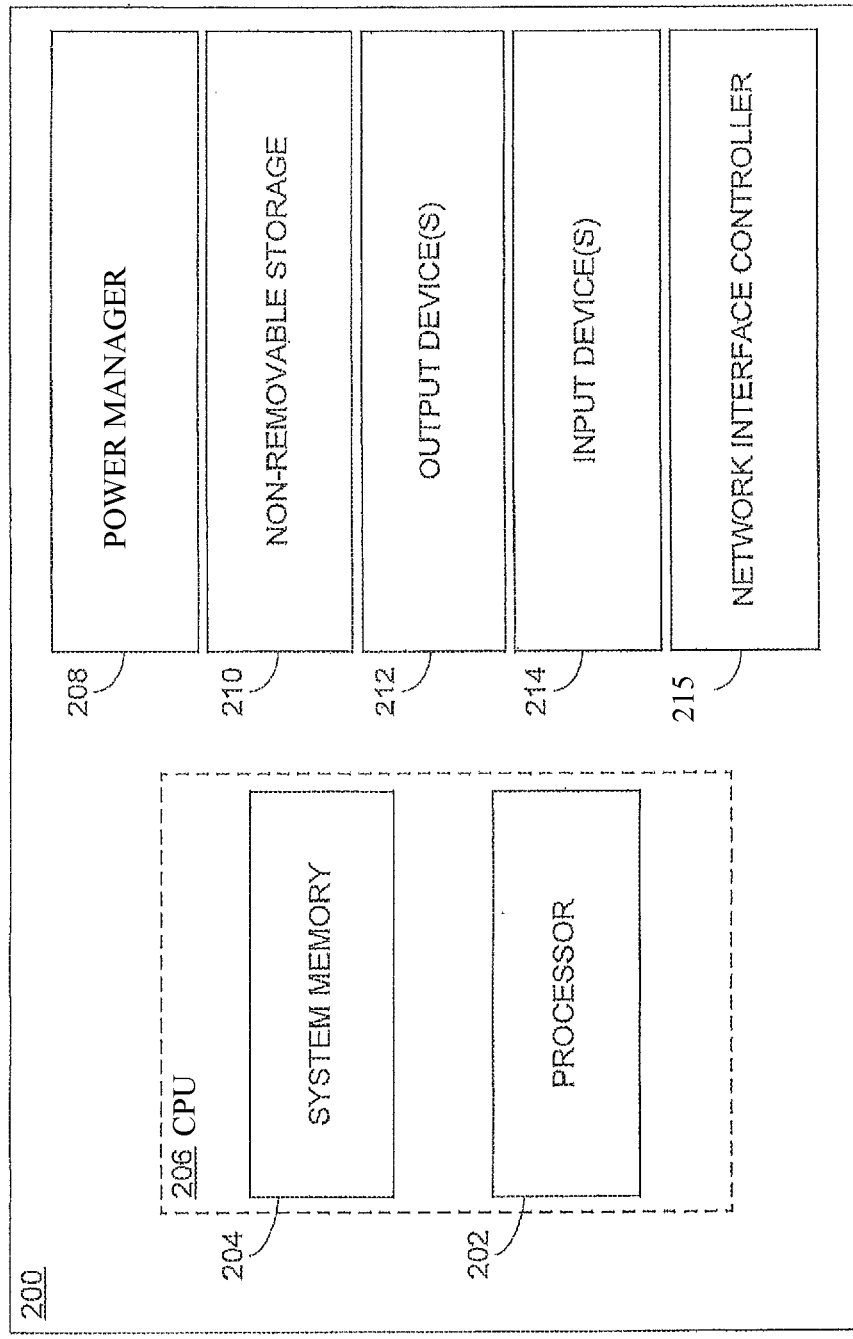
FIG. 1E is a PRIOR ART schematic of an example ECU with computerized hardware that may be used in conjunction with the embodiments of this disclosure.

Terms used in this disclosure are given their broadest plain meanings. For example, this disclosure describes apparatuses and systems for sensor installations described as "proximate sensors." Without limiting the disclosure in any way, one way to visualize a "proximate sensor" is by considering the proximate sensor relative to a primary hand sensor or primary occupant sensor, including, but not limited to, capacitive sensors of the prior art. Accordingly, a proximate sensor may be described as an additional sensing zone that operates in conjunction with, but separate from, a primary sensor that has a direct electrical link, typically by a physical connection, to another computer and voltage source, such as the above described ECU. This disclosure does not limit the kinds of sensors that may be considered a primary sensor, but a primary sensor often utilizes a wired connection to initiate and monitor changes in capacitance due to the presence of an occupant or other conductive object near the primary sensor. A wired connection between a primary sensor and an electronic control unit should not be considered the only kind of primary sensor that can be supplemented with other embodiments of this disclosure because hand sensing and occupant sensing could include wireless transmission of sensor data as well in other configurations.

The proximate sensor described herein is an electrically floating sensing surface that is not physically connected or in direct electrical communication with an electrical control unit or other computer. Instead, the proximate sensor is positioned very near the primary sensor that typically does have a physical electrical connection, whether wired or wireless, to a controller or other voltage source. The proximate sensor establishes an additional sensing zone through its position relative to the primary sensor. For example, when a primary sensor and a proximate sensor are in a consistent or fixed relative position, the electric fields established on the primary sensor (for capacitive sensing or for tracking other physical and electrical phenomena) may also trigger similar field, current or voltage modulation in a nearby proximate sensor. In some embodiments, the primary sensory and the proximate sensor are positioned in a preset dimensional offset configuration, such as layering on a complex shapes such as a steering wheel rim. Due to the very near (0 to 3 mm) positioning, when the primary circuit is energized by a sensing controller it charges the proximate sensor circuit. E-fields are setup from a primary surface of the primary sensor and align to a nearby secondary surface(s) of a proximate sensor. Due to the free electrons in the secondary, or proximate, sensor it also acts as a capacitive proximate sensing surface. As the capacitive signal and therefore e-field, in the primary surface changes, the field profile of the proximate sensor also changes. If a capacitive load is applied to the proximate sensor, such as a hand, an occupant's body, or another conductive object, the e-field interaction between the secondary, proximate sensor to the primary sensor will be detectable by the controller.

The proximate sensing configurations of this disclosure may provide extended sensing zones to areas in a vehicle that were previously unavailable for field effect sensing because direct connections to a controller or other voltage source were too bulky or cumbersome. This disclosure illustrates that by using a proximate sensor embodiment, extended sensing zones are established in very useful vehicle applications.

For example, and without limiting this disclosure, primary sensors of the prior art have been used for applications involving hands-on-heat technology in which the ECU is programmed to provide certain output electrical signals to sensor circuits or shield circuits having appropriate resistance to heat a steering wheel or other vehicle component. In this embodiment, the proximate sensor may be a metallic material, whether wire or knitted mesh, conductive inks applied to a flexible substrate, conductive fabrics, stitched wire, or other metal layer/surface, that is positioned in an area where capacitive hand sensing is desired. Even though hands-on-heat can utilize the heating element wire as the capacitive sensor, it does not provide a sufficient surface density for sensing as compared to a traditional electrode, such as a larger 2 mm stitched wire sensor. This is to say that the spacing between the heating wires for hands-on-heat steering wheel applications is about 6-8 millimeters. This can result in low sensitivity or low Q-count charge values and result in poor sensing margin. Unfortunately, the heating elements used in hands-on-heat steering assemblies cannot increase in stitching density to less than 6-8 mm spacing because the heating element wire must be within a specific heating element resistance of about 1.5 to 2.5 ohms. Increasing the spacing density of the wire would increase the heating element resistance from the desired 1.5 to 2.5 ohms, up to an undesirably large 30-40 ohms. This would result in a heating function for hands-on-heat steering applications that would not meet customer heat-up requirements. A solution is needed to allow both features, hands-on-heat and capacitive sensing, to function together.

One kind of problem solved by a proximate sensor described herein is that additional wire could be stitched next to the heating element wire, possibly on the same heating layer substrate, to increase the effective sensing surface, without making an electrical connection to the heating surface wire. Another solution would be to place a knitted wire mesh, carbon coated fibers, or printed conductive ink, on a substrate surface directly below the heating element substrate material. It could also be positioned co-planar to the heating wire on the same heating wire substrate. This would provide a higher density sensing surface without the complexity of making an additional electrical connection for sensing.

The proximate sensor of this disclosure is also available for use in applications involving rigid or tight fitting materials for coverings on a steering wheel rim or other vehicle component, such as wood trim, carbon fiber layers, or specialized polymers used in vehicle components. For example, the example steering wheel assembly of the prior art FIG. 1A includes an outer skin 20, such as but not limited to a standard hand sensing steering wheel with a leather wrapping. The malleable, somewhat porous nature of leather and engineered plastic steering wheel wraps would accommodate the above-described standard primary sensor for integrating hand sensing in a steering assembly. For steering wheels that utilize wood trim accents or carbon fiber coverings on at least part of the steering wheel, manufacturers typically rely on a formed plastic carrier or shell which the trim material is attached to, and the shell also provides a proper interface to the steering wheel. It is possible to metal coat these plastic shells, or load the plastic with metal particles. It is also possible to use injection molding, or IML, to attach a metallic surface onto the shell. The problem with these procedures is that if a surface to be metallized has a complex shape, it may not be simple to make an electrical connection to the metallized plastic.

The solution for sensing in these complex shapes is to metalize the shell, made of plastic or other polymeric materials, and position a primary sensor there under, which has an electrical connection to a voltage source (e.g. an ECU), in close proximity to the metalized shell. The metallized shell then provides a proximate sensor relative to the primary sensor because the metallized shell has a conductive surface on an opposite side relative to the primary sensor. This addition of a proximate sensor surface can help provide a level of hand sensing to wood or carbon fiber covered steering wheels which is not obtainable with the standard hand sensor under a plastic shell. Furthermore, this kind of additional proximate sensor can be accommodated without the difficulties of working with the shell layer at all. For instance, conductive particles or layers can be added to the material of a steering wheel outer skin (made of leather or synthetic materials), making the outer skin a proximate sensor as well.

This disclosure accounts for engineering developments that take advantage of steering wheel structures providing excellent locations for certain accessories. For example, and without limiting this disclosure, sensors described herein may have to account for other components, such as the light bar technology placed on some steering wheels. Light bar installations are discussed in detail in U.S. Pat. No. 10,036,843, entitled Steering Wheel Light Bar, which issued from U.S. application Ser. No. 15/137,646 and is incorporated by reference herein. In these kinds of applications, the light bar presents an engineering problem because lightbars do not have the ability to provide hand sensing over the lightbar lens. Proximate sensing could be used to provide a level of hand sensing directly over the lightbar lens if the lens has a metallic surface either on top or just under the plastic housing. Different methods exist to add this kind of conductivity to a plastic lens. A conductive lens could be used as the primary e-field source, and a proximate sensor could be positioned nearby that would establish non-physical electrical communication with the fields generated by the conductive lens and provide a sensor circuit positioned near the outside area of the lens.

The figures of this disclosure illustrate numerous embodiments that can be used to establish a proximate sensor relative to a primary sensor having a direct electrical connection to a voltage source and computer. These embodiments provide efficient methods to transmit capacitive signals to a secondary or proximate sensing surface without that proximate sensing surface requiring a direct physical connection to a controller. The embodiments provide several benefits including (i) increased sensing area and charge density while continuing to use a traditional current producing method of electrical connection to an ECU, (ii) increased sensing area and density without changing the existing sensor layout or connection circuits to the ECU, and (iii) the above described sensing installations in difficult to reach areas of a vehicle component.

FIGS. 2A and 2B show a sensor system that accomplishes these benefits with a first electrode 216 serving as a primary electrode with a controller 200 electrically and physically coupled to the first electrode 216. The controller has computerized hardware such as a processor and a memory, the memory storing computer executable instructions for execution by the processor. The computer executable instructions execute software commands that apply a voltage to the first electrode 216 to generate an electric field around the first electrode, which in turn causes the processor to receive an electrical signal back from the first electrode via a connected circuit 236. Continuing with FIG. 2A, the system further includes a second electrode 266, at least a portion of the second electrode being disposed within the electrical field generated by the first electrode, and the second electrode 266 operates while being physically decoupled from the controller 200. The electrical field generated by the first electrode 216 induces a corresponding charge on the second electrode 266, and proximity of a conductive material on or near the first or second electrode alters the electrical signal received back by the controller 200 from the first electrode 216. The conductive material may be a vehicle occupant's hand, another body part, or any object that adjusts the electric field exhibited by the first electrode 216. The sensor system of FIG. 2A illustrates that a controller output transmitted to the first electrode via circuit loop 236 induces the electric field and sets a baseline signal for comparing to the electrical signal received back from the first electrode 216 by the controller processor.

The first electrodes 216, 316, 416, 515, 616, 716, 816 and second electrodes 266, 366, 466, 566, 666, 766, and 866 of the systems shown in the figures represent the primary electrode and the proximate electrode, respectively, as discussed in the above description. At least a portion of each second electrode, operating as a proximate sensor, is in a position that is spaced apart from and extends alongside at least a corresponding portion of the first electrode. The term "spaced apart" is given its broadest meaning and includes all embodiments by which the first and second electrodes are distinguished by separation that defines a void between the electrodes. In other embodiments, the void between the electrodes may include a filler within the void, such as an adhesive or any other structure that is necessary for the application at hand. FIG. 2B illustrates that for embodiments in which the first electrode 216 and the second electrode 266 overlap but still have a spaced apart relationship, an adhesive or other filler 256 separates the electrodes. In some embodiments, such as that of FIG. 5 discussed below, entireties of both the second electrode and the first electrode are spaced apart from each other without overlap and the adhesive or other filler 256 is therefore not necessary in every embodiment. Depending on the installation at hand, each first electrode 216, 316, 416, 516, 616, 716, 816 and each second electrode 266, 366, 466, 566, 666, 766, 866 may be positioned on a single, common substrate or respective substrates, as discussed herein. In embodiments with separate substrates, the goals and operation parameters of the system may be met when the first and second substrates allow for the above described electrode overlap or in other embodiments, the first substrate is spaced apart from the second substrate, at least in part.

Each of the figures of this disclosure illustrate how a conductive material (e.g., a hand to be sensed, an occupant to be sensed, or a conductive object to be sensed) will provide a distinct and measurable change in the electrical signal transmitted back to an ECU if the sensed conductive material is proximate the first, or primary, electrode as shown at reference 375 in FIG. 3A or if the sensed conductive material is proximate the second, or proximate sensor, electrode as shown at reference 375 in FIG. 3B. The proximate sensor portion of the system, illustrated in the figures as the second electrode 266, 366, 466, 566, 666, 766, 866 extends the active surface area that a conductive material can interact with and modulate the tracked electric fields of a given installation.

FIGS. 2A, 2B, 3A, 3B, and 4 illustrate embodiments of this disclosure in which the respective first electrode (the primary sensor) and second electrode (the proximate sensor) overlap when viewed from above but are separated by space or a filler, such as an adhesive when viewed in cross section (i.e., the electrodes are not allowed to short circuit by direct touch). Described another way, in an x-y-z coordinate system, the first substrate and the second substrate overlap at a plurality of x-axis and y-axis coordinates and are spaced apart along a z-axis, the system further including an adhesive extending between overlapping regions of the first substrate and the second substrate.

Figure 4:
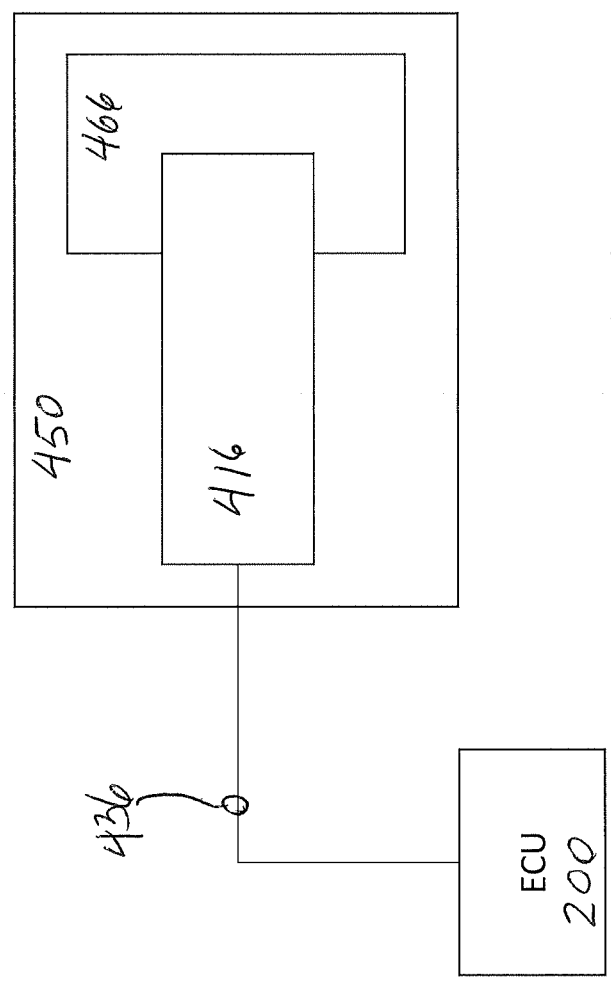
FIG. 4 illustrates a schematic diagram of the proximate sensing system of this disclosure utilizing overlapping sensors on a single substrate according to one implementation of this disclosure.
Figure 5:
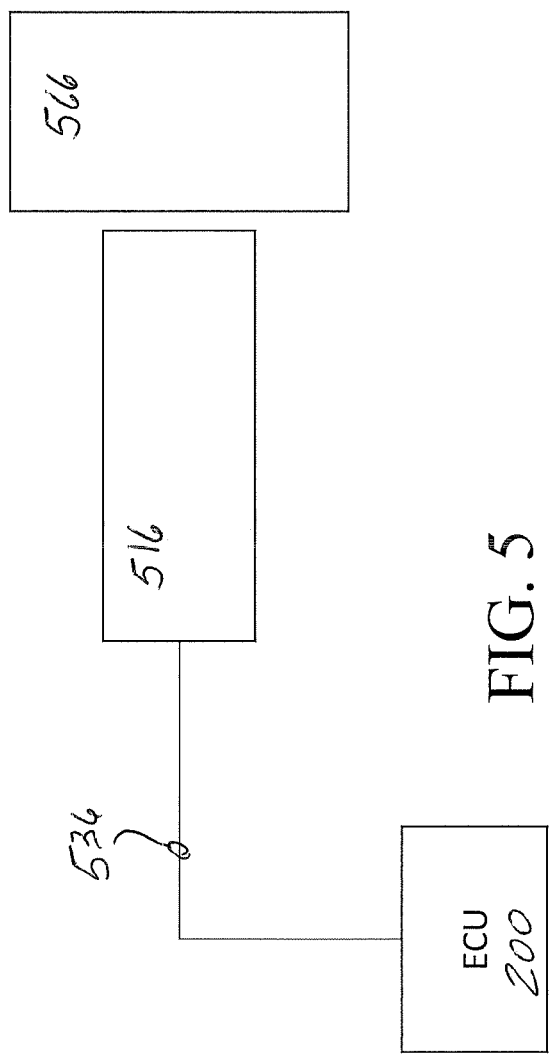
FIG. 5 illustrates a schematic diagram of the proximate sensing system of this disclosure utilizing side-by-side sensors on respective separate substrates according to one implementation of this disclosure.
Figure 6A:
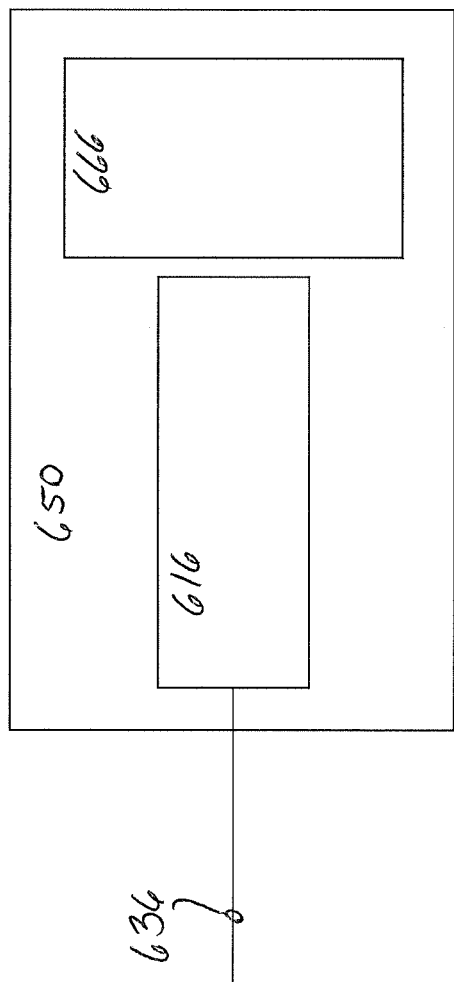
FIG. 6A illustrates a top view of a sensor system according to one embodiment of this disclosure in which sensors are spaced apart alongside each other on the same side of the same substrate.
Figure 6B:
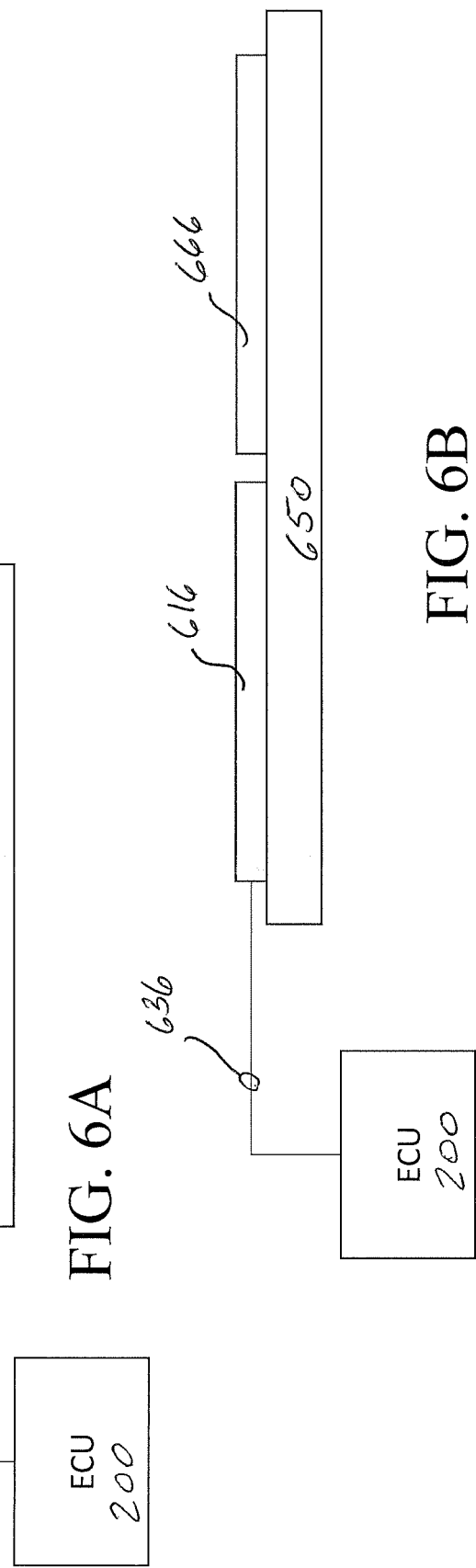
FIG. 6B illustrates a cross section view of the sensor system of FIG. 6A according to one embodiment of this disclosure in which sensors are spaced apart alongside each other on the same side of the same substrate.

Numerous options are available for the relative positions of the first electrodes serving as primary electrodes or primary sensors, the second electrodes serving as proximate sensors, and the substrates used to support each. FIG. 4 illustrates how the primary sensor 416 and the proximate sensor 466 are allowed to overlap, separated by a filler or adhesive, on the same side of a substrate 450. FIGS. 5, 6A and 6B show the sensors spaced apart (with or without other material therebetween), and the substrates are still operated within common electric fields, monitored by an ECU 200, when the electrodes and even respective substrates are spaced apart in a generally aligned position on either the same or separate substrates. FIG. 7 illustrates that the sensors 716, 766 may be positioned on opposite sides of a single substrate 750, and the operational principles still apply when a perimeter of the second electrode is within and spaced apart from a respective perimeter of the first electrode.

The ECU 200 of each embodiment disclosed herein may have respective computerized controls to initiate the output signals that prompt electric fields around the primary electrode and the proximate sensing electrode. As noted above, the ECU transmits an output electrical signal onto the first, primary electrode, which initiates an electric field around at least the first electrode. The circuits connecting the first electrode and the ECU sense the electric fields about the first electrode by a return signal from the first electrode back to the ECU. The return signal can be tracked by capacitive sensing, current sensing, or changes in voltage picked up by the ECU that is typically in a physical connection with the first, or primary sensor, electrode.

The arrangement of mutual field sensing at a first electrode serving as a primary sensor and at a second electrode serving as a proximate sensor has numerous applications in vehicle operation. In one embodiment, the controller transmits a first electrical input to the first electrode that generates heat directed to a steering wheel of a vehicle and the controller transmits a second electrical input to the first electrode that induces the corresponding sensing charge on the second electrode, wherein the first and second electrical inputs are time multiplexed. As shown in FIG. 8, the sensor system may include a third electrode disposed between a steering wheel frame and the first and second electrodes as a pair, the third electrode 870 being physically and electrically coupled to the controller, and the computer executable instructions further cause the processor to transmit on another circuit 836B a third electrical output to the third electrode that shields the first electrical input and the second electrical input on the first electrode from the frame 880 of the steering wheel.

Details of the electrode structures may be adjusted for the installation at hand. In one embodiment, the first electrode has a first end portion and a second end portion, the first end portion being physically coupled to the controller and the second end portion being spaced apart from the first end portion. A respective end portion of the second electrode is disposed adjacent the second end portion of the first electrode within the electric field of the second end portion of the first electrode. This embodiment would include, therefore, the overlapping ends of FIGS. 2 and 3 or the spaced apart ends of FIG. 5. Certain structural details provide numerous options in forming the sensing system disclosed herein. In different embodiments, that may be combined in numerous combinations, overlapping electrodes may be spaced apart by a non-conductive adhesive or other filler filling the space between the electrodes. In other embodiments, the first and second electrode may include a conductive fabric. The conductive fabric may include a non-conductive substrate and conductive wires woven through the non-conductive substrate. The second electrode may provide a proximate sensing surface in the form of a wire mesh. The second electrode may further include a coating of a conductive material on a surface of a vehicle component. All of these embodiments are configured to be installed for use on various components of a vehicle, such as a but not limited to installations in which the first and second electrodes are disposed adjacent a steering wheel frame of a vehicle. At least a portion of the first and/or second electrode may be disposed adjacent a rim portion of the steering wheel frame. In other embodiments, the first and second electrodes are disposed adjacent a seat frame in a vehicle or on other components of a vehicle in which field sensing is useful.

In other descriptions of the sensors and associated systems, a primary electrode may be positioned on or within a physically accessible object, and a controller is connected to the primary electrode such that a charging source subject to the controller charges the primary electrode, wherein, upon the charging, the controller is configured to receive an electrical signal back from the primary electrode. As noted above, the second electrode, referred to as a proximate electrode or proximate sensor, functions as a floating electrode that is mechanically disconnected from outside charging sources. At least a portion of the floating electrode is aligned with the primary electrode on or within the accessible object (e.g., a vehicle component) such that upon the charging of the first electrode, the second electrode exhibits an induced current thereon. In operation, wherein, proximity of a conductive material to either the primary electrode or the floating electrode induces capacitive coupling between the conductive material and the respective primary or floating electrode that alters the electrical signal received by the controller from the first electrode. The controller is configured to track a response of the electrical signal to the capacitive coupling. The portion of the floating electrode aligned with the primary electrode is also spaced apart from the primary electrode, such that when the conductive material is proximate the aligned portion of the floating electrode, the capacitive coupling changes a baseline capacitance at the aligned portion present upon charging the primary electrode. The dimensional references of this disclosure are not limiting but provide examples for perspective. For example, in some embodiments, the floating and primary electrodes are spaced apart by a dimension between 0 and 3 millimeters, inclusive of the endpoints 0 mm and 3 mm. In some embodiments, the floating electrode and the primary electrode are spaced apart in a common plane intersecting each electrode. Another way to describe the electrode positions in these embodiments is that the primary electrode and the floating electrode are parallel to each other on a common substrate.

Without limiting the embodiments to any particular positions or roles in a system, in some embodiments, the primary electrode is a heating element and the floating electrode is a capacitive sensing element. The floating electrode and the primary electrode may be offset from one another in a constant dimensional amount. The controller uses the electrical signal to identify changes in an electrical field strength about the primary electrode due to the proximity of the conductive material. The controller is configured to track changes in the electrical field strength (i.e., amplitude and phase) about the primary electrode, and these changes on the primary electrode can be analyzed to model interactions present between the electrical fields on the primary electrode and corresponding electric fields on the secondary electrode. This data, therefore, allows for monitoring touch events on both the primary and secondary electrodes.

This disclosure is further supported by testing results utilizing a sensor system as disclosed herein and an ECU that analyzes the electrical signal received from the primary electrode. The ECU determined a baseline charge count (Q) for the primary sensor system, wherein the Q count is a ratio of electromagnetic energy stored by the primary electrode to the electromagnetic energy dissipated to the environment per charging cycle. The controller was further configured to identify changes in the baseline Q charge count upon the primary sensor exhibiting capacitive coupling with a conductive material such as an occupant's hand. The controller was also configured to identify changes in the baseline Q charge count upon the primary sensor exhibiting capacitive coupling that has been altered by electric field effects of a proximate sensor used as disclosed herein.

Example Test Observation 1

1. The test was conducted on a 1-zone hands on wheel sensor installation using 2 mm spaced sensing wire with no sensing wire on the steering wheel rim at the 5-7 o'clock area.

2. The sensing wire was formed as a 5 mm wide by 150 mm long sensing electrode having an extension of 170 mm making the total length of the overall sensor 320 mm. The sensing electrode that was originally 5 mm wide and 150 mm long includes the extension that is about 30 mm wide along the extension's 170 mm length.

3. The sensing electrode was made of 0.0035 inch monel wire with a 270 density figure.

4. The 5 mm section was wrapped around the steering wheel rim with the width overlapping a few millimeters to form a "normal sensing area" with a primary electrode. The extension (e.g., about 170 mm long and 30 mm wide) was positioned over the 5-7 o'clock steering wheel section and over the trim material attached over the rim of the steering wheel to form secondary sensor, also referred to herein as a "proximate sensing area" such that at the 5-7 o'clock steering wheel position the proximate sensing area operates without overlapping the primary sensing area, and then overlaps the primary sensing area for the remainder of the extension length.

5. The controller software determining the charge count (Q) was calibrated to zero in the absence of a conductive material (i.e., a hand) on the primary sensor.

6. A two finger touch by an occupant (>$95^{th}$ percentile occupant class) on the normal sensing area induced a charge count of 53 Q.

7. A four finger touch by an occupant (>$95^{th}$ percentile occupant class) on the normal sensing area induced a charge count of 85 Q.

8. A two finger touch by an occupant (>$95^{th}$ percentile occupant class) on the secondary, proximate sensing area induced a charge count of 45 Q.

9. A four finger touch by an occupant (>$95^{th}$ percentile occupant class) on the secondary, proximate sensing area induced a charge count of 45 Q.

Example Test Observation 2

1. The test was conducted on a 1-zone hands on wheel sensor installation using 2 mm spaced sensing wire with no sensing wire on the steering wheel rim at the 5-7 o'clock area.

2. The sensing wire was formed as a 30 mm wide by 320 mm long sensing electrode.

3. The sensing electrode was made of 0.0035 inch monel wire with a 270 density figure.

4. The sensing electrode was wrapped around the steering wheel rim with the width overlapping a few millimeters to form a "normal sensing area" with a primary electrode around the rim other than the portions located at the 5-7 o'clock positions. The remainder of the sensing electrode was positioned over the 5-7 o'clock steering wheel section and over the trim material attached over the rim of the steering wheel to form secondary sensor, also referred to herein as a "proximate sensing area" such that at the 5-7 o'clock steering wheel position the proximate sensing area operates without overlapping the primary sensing area, and then overlaps the primary sensing area for the remainder of the extension length.

5. The controller software determining the charge count (Q) was calibrated to zero in the absence of a conductive material (i.e., a hand) on the primary sensor.

6. A two finger touch by an occupant (>$95^{th}$ percentile occupant class) on the normal sensing area induced a charge count of 52 Q.

7. A four finger touch by an occupant (>$95^{th}$ percentile occupant class) on the normal sensing area induced a charge count of 80 Q.

8. A two finger touch by an occupant (>$95^{th}$ percentile occupant class) on the secondary, proximate sensing area induced a charge count of 115 Q.

9. A four finger touch by an occupant (>$95^{th}$ percentile occupant class) on the secondary, proximate sensing area induced a charge count of 115 Q.

Example Test Observation 3

1. The test was conducted on a 1-zone hands on wheel sensor installation using 2 mm spaced sensing wire with no sensing wire on the steering wheel rim at the 5-7 o'clock area.

2. The sensing wire was formed as a 30 mm wide by 320 mm long sensing electrode.

3. The sensing electrode was made of 0.0035 inch monel wire with a 270 density figure.

4. The sensing electrode length of 170 mm was wrapped around the steering wheel rim with the width overlapping a few millimeters to form a "normal sensing area" with a primary electrode around the rim other than the portions located at the 5-7 o'clock positions. The remainder of the sensing electrode was positioned over the 5-7 o'clock steering wheel section and over the trim material attached over the rim of the steering wheel to form a secondary sensor, also referred to herein as a "proximate sensing area" such that at the 5-7 o'clock steering wheel position the proximate sensing area operates without overlapping the primary sensing area, and then overlaps the primary sensing area for the remainder of the extension length.

5. The controller software determining the charge count (Q) was calibrated to zero in the absence of a conductive material (i.e., a hand) on the primary sensor.

6. A two finger touch by an occupant (>$95^{th}$ percentile occupant class) on the normal sensing area induced a charge count of 55 Q.

7. A four finger touch by an occupant (>$95^{th}$ percentile occupant class) on the normal sensing area induced a charge count of 75 Q.

8. A two finger touch by an occupant (>$95^{th}$ percentile occupant class) on the secondary, proximate sensing area induced a charge count of 166 Q.

9. A four finger touch by an occupant (>$95^{th}$ percentile occupant class) on the secondary, proximate sensing area induced a charge count of 166 Q.

Disclosed are components that can be used to perform the methods and systems of this disclosure. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

As will be appreciated by one skilled in the art, the methods and systems may take the form of an entirely hardware embodiment, an entirely software embodiment, or an embodiment combining software and hardware aspects. Furthermore, the apparatuses, methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Computer program instructions making up the computer software may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Described herein are embodiments of a computer readable medium used to support the sensor systems of this disclosure. The figures present an overview of an embodiment of a computer readable medium for use with the methods disclosed herein. Results can be delivered to a gateway (remote computer via the Internet or satellite) for in graphical user interface format. The described system can be used with an algorithm, such as those disclosed herein.

As may be understood from the figures, in this implementation, the computer may be in the form of the above described electronic control unit (ECU) 200 and include a computer processing unit 206 that communicates with other elements. Also included in the computer readable medium may be any number of output devices 212 and input devices 214 for receiving and displaying data. This display device/input device may be, for example, a keyboard or pointing device that is used in combination with a monitor. The computer system may further include at least one storage device 210, such as a hard disk drive, a CD Rom drive, SD disk, optical disk drive, or the like for storing information on various computer-readable media, such as a hard disk, a removable magnetic disk, or a CD-ROM disk. As will be appreciated by one of ordinary skill in the art, each of these storage devices may be connected to the system bus by an appropriate interface. The storage devices and their associated computer-readable media may provide nonvolatile storage. It is important to note that the computer described above could be replaced by any other type of computer in the art. Such media include, for example, magnetic cassettes, flash memory cards and digital video disks.

Further comprising an embodiment of the system can be a network interface controller 215. One skilled in the art will appreciate that the systems and methods disclosed herein can be implemented via a gateway that comprises a general-purpose computing device in the form of a computing device or computer.

One or more of several possible types of bus structures can be used as well, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus, and all buses specified in this description can also be implemented over a wired or wireless network connection and each of the subsystems, including the processor, a mass storage device, an operating system, network interface controller, Input/Output Interface, and a display device, can be contained within one or more remote computing devices at physically separate locations, connected through buses of this form, in effect implementing a fully distributed system.

The computer typically comprises a variety of computer readable media. Exemplary readable media can be any available media that is accessible by the computer and comprises, for example and not meant to be limiting, both volatile and non-volatile media, removable and non-removable media. The system memory comprises computer readable media in the form of volatile memory, such as random access memory (RAM), and/or non-volatile memory, such as read only memory (ROM).

In another aspect, the ECU 200 can also comprise other removable/non-removable, volatile/non-volatile computer storage media. For example and not meant to be limiting, a mass storage device can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device, including by way of example, an operating system and computational software. Each of the operating system and computational software (or some combination thereof) can comprise elements of the programming and the computational software. Data can also be stored on the mass storage device. Data can also be stored in any of one or more databases known in the art. Examples of such databases comprise, DB2™, MICROSOFT™ ACCESS, MICROSOFT™ SQL Server, ORACLE™, mySQL, PostgreSQL, and the like. The databases can be centralized or distributed across multiple systems.

The ECU 200 can operate in a networked environment. By way of example, a remote computing device can be a personal computer, portable computer, a server, a router, a network computer, a peer device, sensor node, or other common network node, and so on. Logical connections between the computer and a remote computing device can be made via a local area network (LAN), a general wide area network (WAN), or any other form of a network. Such network connections can be through a network adapter. A network adapter can be implemented in both wired and wireless environments. Such networking environments are conventional and commonplace in offices, enterprise-wide computer networks, intranets, and other networks such as the Internet.

Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems described herein can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

The embodiments of the method, system and computer program product described herein are further set forth in the claims below.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. While implementations will be described for steering wheel hand detection systems, it will become evident to those skilled in the art that the implementations are not limited thereto.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

It is important to note that the construction and arrangement of the sensing system for a steering wheel as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting or layering arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present embodiments.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A sensor system for a vehicle steering wheel, comprising:
a first electrode on the vehicle steering wheel;
a connected circuit between the first electrode and a controller, wherein the
controller is electrically and physically coupled to the first electrode via wiring to the connected circuit, the controller having a processor and a memory, the memory storing computer executable instructions for execution by the processor, the computer executable instructions causing the processor to send electrical signals to the first electrode and generate an electrical field at the first electrode,
wherein the first electrode also sends a respective electrical signal back to the controller via the connected circuit;
a second electrode on the vehicle steering wheel, at least a portion of the second electrode being disposed within the electrical field generated by the first electrode, the second electrode being physically decoupled from the controller,
wherein the electrical field generated by the first electrode induces a corresponding charge on the second electrode, and proximity of a conductive material to the first electrode or second electrode alters the respective electrical signal received by the controller from the first electrode;
wherein the controller transmits a first electrical input to the first electrode that generates heat on the steering wheel, and the controller transmits a second electrical input to the first electrode that induces the corresponding charge on the second electrode, wherein the first and second electrical inputs are time multiplexed, and
wherein the electrical signals, transmitted from the controller to the first electrode and generating the electric field, set a baseline signal for comparing to the respective electrical signal received by the controller back from the first electrode.

2. The sensor system of claim 1, wherein at least a portion of the second electrode is in a position that is spaced apart from and extends alongside at least a corresponding portion of the first electrode.

3. The sensor system of claim 2, wherein entireties of both the second electrode and the first electrode are spaced apart from each other.

4. The sensor system of claim 1, wherein the first electrode is disposed on a first substrate, and the second electrode is disposed on a second substrate, the first substrate being spaced apart from the second substrate.

5. The sensor system of claim 4, wherein in an x-y-z coordinate system, the first substrate and the second substrate overlap at a plurality of x-axis and y-axis coordinates and are spaced apart along a z-axis, the system further comprising an adhesive extending between overlapping regions of the first substrate and the second substrate.

6. The sensor system of claim 1, wherein the first electrode is disposed on a first side of a substrate and the second electrode is disposed on a second side of the substrate, wherein the first and second sides are opposite and spaced apart from each other.

7. The sensor system of claim 1, wherein an outer perimeter of the second electrode is within and spaced apart from a respective perimeter of the first electrode.

8. The sensor system of claim 1, further comprising a third electrode disposed between a steering wheel frame and the first and second electrodes as a pair, the third electrode being physically and electrically coupled to the controller, and the computer executable instructions further cause the processor to transmit a third electrical output to the third electrode that shields the first electrical input and the second electrical input on the first electrode from the frame of the steering wheel.

9. The sensor system of claim 1, wherein the first electrode has a first end portion and a second end portion, the first end portion being physically coupled to the controller and the second end portion being spaced apart from the first end portion, and a respective end portion of the second electrode is disposed adjacent the second end portion of the first electrode within the electric field of the second end portion of the first electrode.

10. The sensor system of claim 1, wherein an adhesive layer is disposed between at least a portion of the first electrode and the second electrode.

11. The sensor system of claim 10, wherein the adhesive layer is non-conductive.

12. The sensor system of claim 1, wherein at least a portion of the first and/or second electrode is disposed adjacent a rim portion of a steering wheel frame.

13. The sensor system of claim 1, wherein the first and second electrodes are disposed adjacent a seat frame in a vehicle.

14. A sensor system, comprising:
a primary electrode positioned within an accessible object;
a controller comprising a charging source that charges the primary electrode, wherein, upon the charging, the controller is configured to receive an electrical signal back from the primary electrode;
a connected circuit between the first electrode and the controller, wherein the controller receives the electrical signal back from the primary electrode via the connected circuit;
a floating electrode that is mechanically disconnected from outside charging sources, wherein at least a portion of the floating electrode is aligned with the primary electrode within the accessible object such that upon the charging of the primary electrode, the floating electrode exhibits an induced current thereon;
wherein, proximity of a conductive material to either the primary electrode or the floating electrode induces capacitive coupling between the conductive material and the respective primary or floating electrode that alters the electrical signal received by the controller from the primary electrode; and
wherein the controller is configured to track a response of the electrical signal to the capacitive coupling;
wherein the primary electrode is a heating element and the floating electrode is a capacitive sensing element;
wherein the controller uses the electrical signal to identify changes in an electrical field strength about the primary electrode due to the proximity of the conductive material;
wherein changes in a corresponding electrical field strength about the floating electrode cause a detectable change in an electrical field strength about the primary electrode; and
wherein the portion of the floating electrode aligned with the primary electrode is also spaced apart from the primary electrode, such that when the conductive material is proximate the aligned portion of the floating electrode, the capacitive coupling changes a baseline capacitance at the aligned portion present upon charging the primary electrode.

15. A sensor system for a vehicle steering wheel, comprising:
a first electrode on the vehicle steering wheel;
a controller electrically and physically coupled to the first electrode, the controller having a processor and a memory, the memory storing computer executable instructions for execution by the processor, the computer executable instructions causing the processor to receive an electrical signal from the first electrode;
a second electrode on the vehicle steering wheel, at least a portion of the second electrode being disposed within an electrical field generated by the first electrode, the second electrode being physically decoupled from the controller,
wherein the electrical field generated by the first electrode induces a corresponding charge on the second electrode, and proximity of a conductive material to the first or second electrode alters the electrical signal received by the controller from the first electrode;
wherein the controller transmits a first electrical input to the first electrode that generates heat on the steering wheel, and the controller transmits a second electrical input to the first electrode that induces a corresponding charge on the second electrode, wherein the first and second electrical inputs are time multiplexed; and
a third electrode disposed between a steering wheel frame and the first and second electrodes as a pair, the third electrode being physically and electrically coupled to the controller, and the computer executable instructions further cause the processor to transmit a third electrical output to the third electrode that shields the first electrical input and the second electrical input on the first electrode from the frame of the steering wheel.

* * * * *